United States Patent [19]

Nelson et al.

[11] Patent Number: 5,453,168

[45] Date of Patent: Sep. 26, 1995

[54] METHOD FOR FORMING PROTECTIVE OVERCOATINGS FOR METALLIC-FILM MAGNETIC-RECORDING MEDIUMS

[75] Inventors: Carl W. Nelson, Hayward; Richard D. Weir, Agoura Hills, both of Calif.

[73] Assignee: Tulip Memory Systems, Inc., Fremont, Calif.

[21] Appl. No.: 111,832

[22] Filed: Aug. 25, 1993

[51] Int. Cl.$^6$ .................................................. C23C 14/00
[52] U.S. Cl. ............................. 204/192.16; 204/192.2; 427/131; 427/132; 427/576; 427/577; 428/694 MT; 428/695; 428/698; 428/699
[58] Field of Search ................................ 427/131, 132, 427/576, 577; 204/192.16, 192.2; 428/900, 694, 698, 699, 64, 695

[56] References Cited

U.S. PATENT DOCUMENTS

| | | | |
|---|---|---|---|
| 3,516,860 | 6/1970 | Simmons | 117/236 |
| 3,784,402 | 1/1974 | Reedy, Jr. | 117/69 |
| 4,411,963 | 10/1983 | Aine | 428/622 |
| 4,503,125 | 3/1985 | Nelson et al. | 428/408 |
| 4,876,117 | 10/1989 | Bornstein | 427/130 |

OTHER PUBLICATIONS

Thornton, "Influence Of Apparatus Geometry And Deposition Conditions On The Structure And Topography Of Thick Sputted Coatings", J. Vac. Sci. Technol., vol. 11, No. 4, Jul./Aug. 1974; pp. 666–670.
Hoffman, "Microstructural Control Of Plasma–Sputtering Refractory Coating", Handbook of Plasma Processing Technology; pp. 483–517. (No date available).
Chen, et al. "Growth and Characterization of C:N Thin Films", Surf. Coat. Technol. 54/55, 360 (1992) (No month available).
Aisenberg, et al. "Ion–Beam Deposition Of Thin Films Of Diamondlike Carbon", Journal of Applied Physics, vol. 42, No. 7, Jun. 1971; pp. 2953–2958.
Grill, et al. "Interface Modifications For Improving The Adhesion of a–C:H Films To Metals", J. Mater. REs. 3(2), Mar./Apr. 1988; pp. 214–217.
Nelson, "Metallization And Glassing Of Silicon Integrated Circuits", Proceeding Hybrid Microelectronics Symposium, Dallas, Texas, Sep. 29–Oct. 1, 1969; 413–439.
Westwood, "Porosity In Sputtered Platinum Films", J. Vac. Sci. Technol., vol. 11, No. 1, Jan./Feb. 1974; pp. 466–471.
Weissmantel, "Preparation, Structure, And Properties Of Hard Coating On The Basis Of i–C And i–BN", Thin Films From Free Atoms And Particles, 1985; pp. 153–201 (No month available).
Gorman, et al. "Density Measurement Of Thin Sputtered Carbon Films", ADvances In X–Ray Analysis, vol. 32; pp. 323–330. (No date available).
Grill, et al. "Adhesion And Wear Behavior Of Diamond Like Carbon Films Prepared By RF Plasma", Diamond And Diamond–Like Materials Synthesis, Materials Research Society, Society, Pittsburgh, Pa. (1989); pp. 85–88. (No month available).
Torng, et al. "Structure And Bonding Studies Of The C:N Thin Films Produced By rf Sputtering Method", J. Mater. Res., vol. 5, No. 11, Nov. 1990; pp. 2490–2496.
Thornton, et al. "Internal Stresses In Amorphous Silicon Films Deposited By Cylindrical Magnetron Sputtering Using Ne, Ar, Kr, Xe, and Ar+$H_2$", J. Vac. Sci. Technology, 18(2), Mar. 1981; pp. 203–207.

*Primary Examiner*—Bernard Pianalto
*Attorney, Agent, or Firm*—Limbach & Limbach

[57] ABSTRACT

A sputter-deposited wear-resistant protective coating for magnetic-recording alloy thin films is disclosed. The protective coating includes a protective layer and an interfacial adhesion layer. The protective layer is preferably titanium diboride or amorphous nitrided carbon, and the interfacial adhesion layer is preferably titanium, but can alternatively be other metals, such as zirconium or hafnium, which share characteristics similar to titanium. More broadly, the protective layer may be a nitride, carbide, or boride, or mixture thereof, of titanium, zirconium, hafnium, tantalum, vanadium, niobium, tantalum, chromium, molybdenum, or tungsten, and the interfacial adhesion layer may be the corresponding metal of the protective layer compound.

9 Claims, No Drawings

METHOD FOR FORMING PROTECTIVE OVERCOATINGS FOR METALLIC-FILM MAGNETIC-RECORDING MEDIUMS

FIELD OF THE INVENTION

The present invention generally relates to the field of magnetic-recording disks for storing digital information, and more particularly to protective overcoatings for such recording disks. In even greater particularity the present invention relates to protective overcoatings for magnetic alloy thin-film recording disks.

DESCRIPTION OF THE RELEVANT ART

Magnetic-recording disks with the highest digital storage densities are those wherein the magnetic material is in the form of a cobalt-alloy thin film deposited on a suitably prepared surface of an appropriate substrate material. In the early period of the magnetic-recording industry, cobalt-phosphorus and cobalt-nickel-phosphorus alloys were either electrolytically or electrolessly plated from an aqueous solution. More recently, the magnetic-recording industry has chosen the glow-discharge sputter-deposition process as a much more versatile method to form the cobalt-alloy magnetic layer in terms of the virtually limitless variety of cobalt alloys that can be deposited, of the ease of film deposition control, and of the control possible over the film morphology and hence the magnetic properties.

Since the linear digital recording density of a magnetic-recording disk depends not only on the nature and thickness of the magnetic-recording medium and the characteristics of the magnetic-recording head, but also on the head-to-medium spacing, higher densities can be achieved by flying the head closer and closer over the disk surface. However, the extremely close operational spacing between the head and the rotating disk, as well as the start-stop operations of the drive system, result in an amount of head-disk dynamic contact that imposes severe wear-resisting requirements on the recording disk. The disk surface must exhibit sufficient lubricity to ensure low friction between the head and disk and also must have adequate durability so as to prevent excessive wearing.

As early as 1968, high-radiofrequency glow-discharge sputter-deposited carbon was suggested as a wear-resistant protective overcoating for cobalt-alloy metallic-film magnetic-recording disks. During 1970–1971, this suggestion was successfully implemented at Data Disc, Inc., Palo Alto, Calif. The protective overcoating of that invention included an interfacial adhesion layer of sputtered titanium bonded to the cobalt-alloy magnetic medium and a layer of sputtered carbon bonded to the titanium layer. This work is described by C. W. Nelson and M. B. Vye in U.S. Pat. No. 4,503,125, issued Mar. 3, 1985.

Rather than strictly following the teaching of this patent, the industry in its practice merely deposits the carbon protective overlayer from dc-powered magnetron diode sputtering sources, without substrate bias sputtering, and usually in the 15 to 30 mtorr (2.0 to 4.0 Pa) pressure range, directly onto the cobalt-alloy magnetic layer. Such prepared carbon protective overlayers are ubiquitous in the disk media products produced by this industry. Under these sputtering conditions the resulting carbon films have a thermalized-atom-deposited porous columnar Zone 1 or even more porous Zone 1' structure as shown on the Movchan-Demchishin-Thornton zone-structure diagram [J. A. Thornton, J. Vac. Sci. Technol. 11, 666 (1974); D. W. Hoffman and R. C. McCune in "Handbook of Plasma Processing Technology", S. M. Rossnagel, J. J. Cuomo, and W. D. Westwood, eds., Ch. 21, pp. 483–517, Noyes Publications, Park Ridge, N.J. (1990)].

Films with the Zone 1 or Zone 1' structure are not only porous, but also are characterized by having low adhesive strength because of the abrupt film-substrate interfacial boundary, and low cohesive strength because of the open grain boundaries, thereby fracturing intergranularly. Many tribological problems pertaining to the head-disk interface arise from these microstructurally weak sputter-deposited films. Sputtering does not necessarily result in films with strong adhesion, toughness, and endurance. However, sputtering can result in films with these desirable characteristics provided that conditions are chosen so that films with the energetic-atom-deposited dense fibrous Zone T structure are formed in conjunction with the selection of a proper interfacial adhesion layer.

The two crystalline forms of carbon are graphite and diamond with densities of 2.267 g/cm$^3$ and 3.515 g/cm$^3$, respectively. Usually, the nonequilibrium metastable phase of an element has higher entropy than the equilibrium stable phase. Carbon is an exception to this generality, with graphite the stable form having the higher entropy, and diamond the metastable form having the lower entropy. Thin films of carbon are generally amorphous but the structure can vary all the way from essentially graphite-like with trigonal bonding to essentially diamond-like with tetrahedral bonding. Amorphous carbon films, when deposited in Zone T and also the region of Zone 1 near Zone T, appear to lack grain boundaries (i.e., they are continuous) and thus are better characterized as vitreous (i.e., glassy).

Just at what argon pressure, in a planar sputtering configuration for a typical source-to-substrate spacing of 76 mm (3.0 inches) and in the absence of substrate biasing, does the change in internal (deposition) stress from compressive to tensile, corresponding to the Zone T to Zone 1 transition, take place is not known for carbon. However, it is known that, again in the absence of substrate biasing, grain boundaries and columnar grains begin to appear at 7.5 mtorr (1.0 Pa) argon pressure. Since the stress transition in amorphous silicon films has been determined to be at 4.5 mtorr (0.6 Pa) in the absence of substrate biasing [J. A. Thornton and D. W. Hoffman, J. Vac. Sci. Technol. 18, 203 (1981)], it is very likely that a similar value could be expected for carbon.

The density of carbon films, deposited from a dc-powered planar magnetron diode sputtering source in the absence of substrate biasing over the range from 1.0 to 30.0 mtorr (0.133 to 4.0 Pa), decreases at the rate of 1.22 percent per mtorr increase in argon pressure and ranges from 2.29 g/cm$^3$ at 1.0 mtorr (0.133 Pa) to 1.48 g/cm$^3$ at 30.0 mtorr (4.0 Pa) [G. L. Gorman, M.-M. Chen, G. Castillo, and R. C. C. Perera in "Advances in X-Ray Analysis", Vol. 32, ed. by C. S. Barrett, J. V. Gilfrich, R. Jenkins, T. C. Huang, and P. K. Predecki, Plenum Press, New York, N.Y. (1989), pp. 323–330].

As amorphous carbon films are produced deeper into Zone 1 and Zone 1' at higher and higher sputtering gas pressures, the bonding ratio of trigonal (graphite-like) to tetrahedral (diamond-like) increases. Thus the grain conductivity would be expected to increase, but, in fact, the film resistivity increases because of the widening open grain boundaries being the predominant effect in exactly the same way as occurs with Zone 1 and Zone 1' metal films. For example, in the case of Zone 1 and Zone 1' sputter-deposited platinum films, the density decreases and thus the pore volume increases at the rate of 0.25 percent per mtorr increase in argon pressure [W. D. Westwood, J. Vac. Sci. Technol. 11, 466 (1974)].

The provision of sufficiently (and not excessively) high energetic ion and/or atom bombardment during the deposition of carbon films promotes the Zone T microstructure with dense continuous smooth films resulting, and also diamond-like character with increased hardness, optical transparency, electrical resistivity, and chemical inertness resulting.

The present period of widespread interest in this topic was initiated in 1971 with the report of diamond-like amorphous carbon films having been obtained in a system consisting of a solenoidal-magnetic-field-enhanced 13.56 MHz high-radiofrequency-powered extraction-ion-beam deposition source from which both carbon ($C^+$) and argon ($Ar^+$) ions were extracted and accelerated onto a substrate at a negative potential of −40 to −100 V; the substrate, on which the carbon atoms and ions were deposited, being located in the high-vacuum section [S. Aisenberg and R. Chabot, J. Vac. Sci. Technol. 8, 1 (1971); J. Appl. Phys. 42, 2953 (1971)].

In 1976, it was demonstrated that diamond-like amorphous carbon films can be obtained in a system having two argon-ion broad-beam sources, the first arranged to bombard and sputter a graphite target and the second to simultaneously bombard the substrate and thus control the resputtering of the arriving carbon atoms by argon ions of some 100 eV energy [C. Weissmantel, Vide 183, 107 (1976); C. Weissmantel, "Preparation, Structure, and Properties of Hard Coatings", in "Thin Films from Free Atoms and Particles" K. J. Klabunde, ed , Ch. 4, pp 153–201, Academic Press, Orlando, Fla. (1985)].

Simultaneously and independently during 1970–1971 for the thin-film magnetic-recording disk application, the process was developed for the sequential sputter deposition of a titanium (Ti) interfacial adhesion layer and a carbon (C) protective overlayer onto the cobalt-alloy ferromagnetic layer. A 13.56 MHz high-radiofrequency-powered double planar-disk-diode sputtering system was used in which the developed dc bias voltages with respect to ground, from the applied rf substrate bias voltages, were −100 V and −50 V for the titanium and carbon depositions, respectively. In the disk drives designed and manufactured by Data Disc, Inc., it was established that this combination of materials and conditions provided the required wear-durability at the head-disk interface.

The resulting carbon films are very hard yet possess valuable lubricating qualities. The high microhardness of these films is characterized by high internal (deposition) compressive stress, which jeopardizes the adhesion of these films on substrates, and therefore limits their technical application. For this reason, it was found necessary to include an interfacial adhesion layer of titanium in order to distribute this stress across a graded diffusion or pseudodiffusion region, instead of concentrating the stress at an abrupt junction in the absence of such an interfacial layer.

Titanium was selected to provide the diffusion or pseudodiffusion interfaces with the underlying magnetic layer and the carbon overlayer because it forms a most stable carbide. Moreover, nickel does not form a carbide and cobalt only a marginally stable one. The interfaces are characterized by a gradual change in composition and lattice parameter across the interfacial regions. The formation of this type of interface requires that there be diffusion between the two materials meaning that there be some degree of solubility, in this case between titanium and carbon and between titanium and the cobalt alloy. In this way, the strains associated with the energetic deposition and the lattice mismatches are distributed across the interfacial layer. The application of substrate bias sputtering augments this diffusion because of the effect of atom peening. The term "pseudodiffusion" designates an interfacial region formed under such high-energy conditions.

On sample disks made without the titanium interfacial adhesion layer, the amorphous carbon overlayer delaminated from the magnetic layer, often after several days or a few weeks with these sample disks merely at ambient. When such sample disks were wear-tested before delamination would occur, the amorphous carbon overlayer would tend to crystallize to graphite in those areas subject to the sliding friction of the ferrite head, i.e., the wear tracks would become intensely black, in obvious contrast to the adjacent untouched regions.

Incorporating the titanium interfacial adhesion layer eliminated problems of delamination and graphitization of the amorphous carbon overlayer. These problems do not occur when this layer is employed and, of course, properly deposited.

Very similar wear-durability results to the above have been reported more recently for diamond-like amorphous hydrogenated carbon films deposited directly on single-crystal silicon substrates and deposited on metal substrates provided with an interfacial adhesion layer of amorphous silicon [A. Grill, B. S. Meyerson, and V. Patel, J. Mater. Res. 3, 214 (1988); A. Grill, B. S. Meyerson, and V. Patel in "Diamond and Diamond-Like Materials Synthesis", G. H. Johnson, A. R. Badzian, and M. W. Geis, eds., Materials Research Society, Pittsburgh, Pennsylvania (1988), p. 85]. The diamond-like amorphous hydrogenated carbon films of 500 to 1500 Å thickness were prepared on the various substrates at temperatures of 30° to 250° C. from the reactive plasma decomposition of acetylene ($C_2H_2$) with the use of a 13.56 MHz high-radiofrequency-powered diode at 30 mtorr pressure and having a developed dc bias of −150 V at the substrate. These films were found to have a diamond-pyramidalindentation microhardness of about 49 GPa (5000 kg/mm$^2$) and to be under an internal (deposition) compressive stress of 2 GPa ($2\times10^{10}$ dyn/cm$^2$).

The adhesion and wear behavior of these films on the single-crystal silicon substrates, regardless of the substrate temperature during deposition, was found to be excellent, the fracture produced by the adhesion tester always having occurred in the substrate and not at the interface. On the other hand, when these films were directly deposited on metallic layers of chromium (Cr), cobalt (Co), nickel (Ni), molybdenum (Mo), and various alloys thereof (such materials being of interest for thin-film magnetic-recording disks), the adhesion was extremely poor, regardless of the substrate temperature during deposition. However, with the addition of an interfacial adhesion layer of only 20 to 40 Å of amorphous silicon, the adhesion became excellent and fracture occurred only in the substrate. This striking result is attributed to the formation of diffusion or pseudodiffusion interfacial regions of silicon carbide at one junction and the corresponding metal silicide at the other, with strongly bonded graded junctions having occurred.

When thicker (greater than 100 Å) intermediate silicon layers were used, the fracture occurred sometimes in the metal layer and at other times between the metal layer and the single-crystal silicon substrate. In this case, a greater amount of metal silicide is formed and with the attendant volume shrinkage occurring, a vacancy surplus appears which is eliminated by agglomeration into pores or voids (the Kirkendall effect). The appearance of voids, cracks, and separations in the interfacial region from the formation of a phase or phases associated with substantial volume shrinkage would, of course, greatly weaken the microstructure and cause adhesion failure.

When titanium is used as the interfacial adhesion layer, this problem is avoided, regardless of the thickness, in the formation of the graded diffusion or pseudodiffusion regions of titanium carbide and/or carbon in solid solution with titanium and of titanium in solid solution with the cobalt-nickel alloy.

In wear testing, it was found that the protective diamond-like amorphous hydrogenated carbon overlayer with a very thin amorphous silicon interfacial adhesion layer on nickel and molybdenum surfaces reduced to zero the wear of these disks. Without this coating combination these disks experienced significant wear under the same testing conditions.

SUMMARY OF THE INVENTION

The present invention is a wear-resistant protective overcoating for cobalt-alloy metallic-film magnetic-recording disks and the method for forming the same. The invention expands both the materials that may be used as the protective layer and as an interfacial layer.

The present invention in its most basic form comprises two layers of sputtered material on a cobalt-alloy metallic-film magnetic disc. The first layer is an interfacial adhesion layer of sputtered titanium. The second layer is either sputtered titanium diboride or sputtered amorphous nitrided carbon (also known as amorphous carbon nitride).

The sputter-deposited amorphous nitrided carbon films are obtained in a 13.56 MHz high-radiofrequency-powered double planar-disk-diode sputtering system from a graphite target in an argon-nitrogen gas discharge [C. J. Torng, J. M. Sivertsen, J. H. Judy, and C. Chang, J. Mater. Res. 5, 2490 (1990)], and also in a dc-powered planar-magnetron-diode sputtering system from a graphite target in a nitrogen or an argon-nitrogen gas discharge [M. Y Chen., X. Lin, V. P. Dravid, Y. W. Chang, M. S. Wong, and W. D. Sproul, Surf. Coat. Technol., 54/55, 360 (1992)].

The present invention also broadens the number of elements that can be used for the interfacial adhesion layer. Since the transition-metal Periodic Table Group IV and the heaviest of Group V carbides (TIC, ZrC, HfC, and TaC, respectively) are the most stable carbides, then titanium (Ti), zirconium (Zr), hafnium (Hf), and tantalum (Ta) are equally effective in serving as the interfacial adhesion layer between the cobalt-alloy magnetic layer and the protective overlayer of amorphous carbon or amorphous hydrogenated carbon. Since titanium (Ti), zirconium (Zr), and hafnium (Hf) also form the most stable nitrides, then these metals are equally effective in serving as the interfacial adhesion layer between the cobalt-alloy magnetic layer and the protective overlayer of amorphous nitrided carbon.

The periodic trends in stabilities indicated here have been established from the comparison of thermodynamic data and were reported in 1969 [C. W. Nelson, Proceedings Hybrid Microelectronics Symposium, Dallas, Tex., Sept 29–Oct. 1, 1969], as follows:

The borides, carbides, and nitrides of the Groups IVa, Va, and VIa transition metals are refractory and rather unreactive chemically. The Group IVa and the heaviest of the Group Va monocarbides (TIC, ZrC, HfC, and TaC, respectively) are the most stable carbides. The Group IVa nitrides are more stable than the corresponding Group IIIa nitrides because metallic bonding is operative in addition to the forces acting in the Group III saturated-valence nitrides. The Group Va nitrides are a little less stable than the corresponding Group IIIa nitrides despite the contributions of metallic bonds in the former. It is especially noteworthy that the decrease in stability (i.e., the free energy of formation and enthalpy of formation become less negative) with increasing metal group number from IVa to VIII found for the nitrides and carbides is also demonstrated by the borides and silicides, and that this decrease in stability becomes less pronounced in the sequence: nitrides, carbides, borides, and silicides. Interestingly, the free energies of formation and the enthalpies of formation per gram-atom of nonmetallic constituent for the sequence: nitrides, carbides, borides, and silicides, become successively less negative in the case of Group IVa but become successively more negative in the case of Group VIII. In fact, of the platinum group metals, Ru, Os, Rh, Ir, Pd, Pt, none form nitrides and only Ru and Os form carbides, whereas all form very stable silicides.

The nitrides, carbides, and borides of the Periodic Table Groups IV, V, and VI transition metals share similar physical properties and mechanical characteristics in their hardness, refractoriness, and chemical inertness. Consequently, the wear-resistant protective overcoating of the present invention can include nitrides, carbides, and borides of titanium (Ti), zirconium (Zr), hafnium (Hf), vanadium (V), niobium (Nb), tantalum (Ta), chromium (Cr), molybdenum (Mo), and tungsten (W) with the corresponding metal as the interfacial adhesion layer bonded to the underlying cobalt-alloy layer.

Under the present invention, a sputtering target of the respective metal is used with a gas discharge of an appropriate argon-nitrogen (Ar—$N_2$) or argon-ammonia (Ar—$NH_3$) gas mixture to form the corresponding nitride; similarly, an appropriate argon and hydrocarbon, such as methane ($CH_4$), ethylene ($H_2C=CH_2$), or acetylene (HC≡CH), gas mixture to form the corresponding carbide; and an appropriate argon and diborane ($B_2H_6$) gas mixture to form the corresponding boride, by reactive sputter deposition, respectively.

One of the major merits of sputtering is that from targets of complex materials, containing two or more components, films can be deposited usually without composition changes. Accordingly, protective overlayers of any number of compositions in mixed binary-alloy systems of the above-listed binary systems can be readily obtained with the appropriate selection of the metal-alloy sputtering target. For example, if a film with composition $Ti_{0.75}Nb_{0.25}N$ is desired, then a metal binary-alloy target comprising 75 atom percent titanium and 25 atom percent niobium would be selected. The nitride overlayer would be formed by sputtering from this target in an argon-nitrogen (Ar—$N_2$) gas discharge. The interfacial adhesion layer would have the same composition as the target.

Carbon films are known to possess a high microhardness and have valuable lubricating qualities, making them desirable materials for protective overcoatings. Unfortunately, the technical application of carbon films is limited because these films are characterized by high internal compressive stress, thereby jeopardizing the adhesion on substrates.

The present invention is advantageous over prior wear-resistant coatings because it employs an interfacial adhesive layer to distributes the stress across a graded diffusion or pseudodiffusion region, instead of concentrating the stress at an abrupt junction.

The present invention has the further advantage of avoiding substantial volume shrinkage and a weakened microstructure associated with silicon by employing titanium, zirconium, hafnium, or tantalum as the interfacial adhesion layer. This interfacial adhesion layer is also advantageous because it eliminates problems of delamination and graphitization associated with a lone carbon overlayer.

Furthermore, the combination of reactive sputtering and reactive plasma deposition provides an important advantage of increased carbon deposition rates.

DESCRIPTION OF THE PREFERRED EMBODIMENT

Reference will now be made in detail to the preferred embodiments of the invention. While the invention will be described in conjunction with the preferred embodiments, it will be understood that they are not intended to limit the invention to those embodiments. On the contrary, the invention is intended to cover alternatives, modifications, and equivalents, which may be included within the spirit and scope of the invention as defined by the claims. Those of ordinary skill in the art will recognize that the principles of the present invention are applicable to any magnetic alloy thin-film recording disk that includes any suitable substrate (or coated substrate) over which is formed a magnetic alloy film. Furthermore, any indications of coating thicknesses are meant to be illustrative only.

Sputtering is the preferred method for depositing the interfacial adhesion layer and the protective overlayer onto the cobalt-alloy magnetic layer of a magnetic-recording disk. As the film thicknesses required for the various layers: the chromium or chromium-alloy underlayer, the cobalt-alloy magnetic layer, the interfacial adhesion layer, and the protective overlayer, are all relatively thin, sputtering offers the simplest deposition method to obtain thin films with controlled thickness and excellent reproducibility.

Typical sputtering configurations include the dc-powered planar disk diode; the high-radiofrequency powered (13.56 MHz rf) planar disk diode; the dc- or rf-powered planar disk triode with its thermionic hot-filament cathode; various dc- or rf-powered magnetron diode forms, such as the cylindrical post, the cylindrical hollow, the planar disk, the planar rectangular, the planar circular annular ring, the conical ring, and the cylindrical ring. Regardless of the sputtering configuration chosen, a second separately powered diode on which the disk substrate(s) is held is required so that substrate sputter-etching prior to deposition and substrate bias sputtering during deposition can be provided.

The thickness of the interfacial adhesion layer is not critical, but should be as thin as possible. In a magnetic-recording disk drive, the head-to-medium spacing comprising both the flying height and the thicknesses of the interfacial adhesion layer and the protective overlayer must be minimal in order to maximize the linear digital recording density. By way of illustration, a thickness of 20 to 100 Å has been found to provide effective adhesion of the protective overlayer to the underlying cobalt-alloy magnetic layer. To a point, the thickness of the protective overlayer is also noncritical. However, if this thickness is reduced much below 200 Å, significantly increased wear results.

In the fabrication of magnetic-recording disks, the most common technique for depositing the various thin-film layers is magnetron diode sputtering. The sputtering system approaches that are used in the production of magnetic-recording disks consist mainly of two configurations: 1) for each thin-film layer, dual-side coating of a single disk substrate in the static-deposition mode from a pair of circularly symmetric planar (or planar ring) magnetron diode sputtering sources, and 2) for each thin-film layer, dual-side coating of a platen of several disk substrates in the dynamic-deposition (passby) mode from a pair of rectangular planar magnetron diode sputtering sources.

Both approaches are best accomplished in systems where process-isolated chambers are provided so that the substrate outgassing, sputter-etch cleaning, and heating steps, from which reactive gases (water vapor, air, organic solvents) are evolved, do not interfere with the inert-gas sputter-deposition steps. Similarly, a sputter-deposition step, involving a target material where a reactive gas (or gases) is intentionally employed or involving a target material whose composition comprises a reactive-gas constituent or whose microstructure contains a reactive gas (or gases) in its micropores, must be carried out in an isolated process chamber. The inert-gas (argon) sputter-deposition steps entail in sequence the chromium or chromium-alloy underlayer, the cobalt-alloy magnetic layer, and the interfacial adhesion layer. Care must be taken to reduce the residual active gases during these steps, because these gases in a glow discharge provide a very reactive chemical medium for the materials involved in these steps and thus have a deleterious effect on the morphology and physical properties of the respective deposited films.

In the aforementioned static- and dynamic-deposition sputtering system approaches, due to the requirement of product throughput, the sequential steps are essentially simultaneously operated so that there is a disk at or a platen of disks passing by each of the several stations, respectively. For the deposition of the protective overlayer, a single isolated process station is required, in the case of a material selected from the group of nitrides, carbides, or borides of titanium (Ti), zirconium (Zr), hafnium (Hf), vanadium (V), niobium (Nb), tantalum (Ta), chromium (Cr), molybdenum (Mo), tungsten (W), or alloys thereof, wherein the sputtering targets would be comprised of the corresponding metal. The interfacial adhesion layer is formed first by sputtering from the metal targets in a low-pressure argon glow discharge followed by the protective overlayer formed by reactive sputtering from the same metal targets in a low-pressure argon and appropriate reactive gas glow discharge. For nitrides, an appropriate argon-nitrogen (Ar—$N_2$) or argon-ammonia (Ar—$NH_3$) gas mixture would be used; for carbides, an appropriate argon and hydrocarbon, such as methane ($CH_4$), ethylene ($H_2C$=$CH_2$), or acetylene (HC≡CH), gas mixture; and for borides, an appropriate argon and diborane ($B_2H_6$) gas mixture. For a mixed system, such as a carbonitride, an appropriate gas mixture of argon (Ar), ammonia ($NH_3$), and methane ($CH_4$), for example, would be used. The combinations possible in terms of the number of suitable metals and alloys thereof and of the number of appropriate reactive gases are virtually limitless.

For the case of amorphous carbon, amorphous hydrogenated carbon, or amorphous nitrided carbon as a protective overlayer, two isolated process stations are required, the first containing sputtering targets of titanium (Ti), zirconium (Zr), hafnium (Hf), or tantalum (Ta) for the deposition of the interfacial adhesion layer, and the second containing sputtering targets of graphite, pyrolytic graphite, or vitreous carbon, and provided with gas lines of argon (Ar), argon (Ar) and hydrogen ($H_2$), or argon (Ar) and nitrogen ($N_2$) for the deposition of the desired protective overlayer. Alternatively, in the second isolated process station, reactive plasma deposition (also know as plasma-enhanced or plasma-assisted chemical vapor deposition) wherein the carbon source is not from a sputtering target but rather from a hydrocarbon gas, such as methane ($CH_4$), ethylene ($H_2C=CH_2$), acetylene ($HC\equiv CH$), or benzene ($C_6H_6$), could be used. Furthermore, the combination of sputtering and reactive plasma deposition provides the important advantage of increased carbon deposition rates.

Since films with maximum adhesive and cohesive strengths are desired for wear-durability, the sputtering conditions must be chosen so that all the various layers are formed with the energetic-atom-deposited dense fibrous Zone T structure. The simplest most versatile way to obtain films with the Zone T structure is to provide substrate bias sputtering during deposition. From the applied rf substrate bias voltages, the developed dc bias voltages measured with respect to ground would range from $-100$ to $-300$ V for the above-listed metals and the nitrides, carbides, and borides thereof, and from $-50$ to $-150$ V for the various amorphous carbons; the higher the plasma density at the substrate (or substrates), the lower the voltage required, and the higher the deposition rate, the higher the voltage required. This preferred embodiment of the invention applies not only to the formation of the interfacial adhesion layer and the protective overlayer, but also to the chromium or chromium-alloy underlayer and the cobalt-alloy magnetic layer. Should the third and fourth layers (the interfacial adhesion layer and the protective layer) be formed with the energetic-atom-deposited dense fibrous Zone T structure and the first and second layers (the chromium and cobalt-alloy layers) with the thermalized-atom-deposited porous columnar Zone 1 or more porous Zone 1' structure, the tribological failure will occur within the first and second layers because they are microstructurally weak. The overall layer structure is no better than its weakest link. Although the present invention pertains specifically to the subject of the interfacial and protective layers, the success of its application depends upon applying the same principles to the chromium or chromium-alloy layers and the cobalt-alloy magnetic layers.

From the above description, it will be apparent that the invention disclosed herein provides a novel and advantageous protective overcoating for a magnetic-recording disk. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method for depositing an interfacial layer and a protective layer on a magnetic-recording medium having a magnetic-recording layer, which method comprises the steps of:

depositing an interfacial layer on the magnetic-recording layer, wherein the interfacial layer is composed of titanium, zirconium, hafnium, vanadium, niobium, tantalum, chromium, molybdenum, or tungsten; and then depositing a protective layer on the interfacial layer, wherein the protective layer is composed of a nitride, carbide, or boride of the element used in the interfacial layer.

2. A method as recited in claim 1 wherein the step of depositing an interfacial layer is performed by sputtering titanium, and wherein the step of depositing a protective layer is performed by reactive sputtering titanium diboride.

3. A method as recited in claim 1, wherein the steps of depositing the interfacial layer and the protective layer include forming energetic-atom-deposited dense fibrous Zone T structures for the interfacial layer and the protective layer.

4. A method as recited in claim 3, wherein the steps of depositing the interfacial layer and the protective layer include steps of substrate bias sputtering.

5. A method as recited in claim 1, wherein the step of depositing a protective layer includes sputtering a mixed binary compound of nitrides, carbides, or borides of titanium, zirconium, hafnium, vanadium, niobium, tantalum, chromium, molybdenum, or tungsten.

6. A method for depositing an interfacial layer and a protective layer on a magnetic-recording medium having a magnetic-recording layer, which method comprises the steps of:

depositing an interfacial layer on the magnetic-recording layer, wherein the interfacial layer is composed of titanium, zirconium, or hafnium; and then depositing a protective layer on the interfacial layer, wherein the interfacial layer is composed of amorphous nitrided carbon over the interfacial layer.

7. A method as recited in claim 6 wherein the step of depositing an interfacial layer is performed by sputtering titanium.

8. A method as recited in claim 6, wherein the steps of depositing the interfacial layer and the protective layer include forming energetic-atom-deposited dense fibrous Zone T structures for the interfacial layer and the protective layer.

9. A method as recited in claim 8, wherein the steps of depositing the interfacial layer and the protective layer include steps of substrate bias sputtering.

* * * * *